(12) United States Patent
Chen et al.

(10) Patent No.: US 6,527,912 B2
(45) Date of Patent: Mar. 4, 2003

(54) STACKED RF EXCITATION COIL FOR INDUCTIVE PLASMA PROCESSOR

(75) Inventors: Jian J. Chen, Fremont, CA (US); Robert G. Veltrop, Eagle, ID (US); Thomas E. Wicker, Reno, NV (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/821,752

(22) Filed: Mar. 30, 2001

(65) Prior Publication Data

US 2002/0140359 A1 Oct. 3, 2002

(51) Int. Cl.[7] .............................................. H05H 1/100
(52) U.S. Cl. ................. 156/345.48; 118/723 I
(58) Field of Search .................... 156/345.48; 118/723 I

(56) References Cited

U.S. PATENT DOCUMENTS

| | | |
|---|---|---|
| 4,948,458 A | 8/1990 | Ogle |
| 5,226,967 A | 7/1993 | Chen et al. |
| 5,277,751 A | 1/1994 | Ogle |
| 5,304,279 A | 4/1994 | Coultas et al. |
| 5,368,710 A | 11/1994 | Chen et al. |
| 5,401,350 A | 3/1995 | Patrick et al. |
| 5,558,722 A | 9/1996 | Okumura et al. |
| 5,759,280 A | 6/1998 | Holland et al. |
| 5,795,429 A | 8/1998 | Ishii et al. |
| 5,800,619 A | 9/1998 | Holland et al. |
| 5,847,074 A | 12/1998 | Yamasaki et al. |
| 6,028,395 A | 2/2000 | Holland et al. |
| 6,164,241 A | 12/2000 | Chen et al. |
| 6,320,320 B1 * | 11/2001 | Bailey et al. ........... 156/345.48 |

FOREIGN PATENT DOCUMENTS

| | | |
|---|---|---|
| EP | 0 807 953 A | 11/1997 |
| JP | 11 312667 A | 11/1999 |

* cited by examiner

*Primary Examiner*—Thi Dang
(74) *Attorney, Agent, or Firm*—Lowe Hauptman Gilman & Berner, LLP

(57) ABSTRACT

A radio frequency excitation coil of an inductive plasma processor includes a planar turn connected in series with a segment of the coil stacked above a portion of the planar turn. The stacked segment is placed around a region having weak radio frequency coupling to plasma due to azimuthal asymmetries in the chamber and/or the excitation coil. In a single winding embodiment, the stacked segment is close to an interconnection gap between two adjacent planar turns and extends in both directions from the gap to compensate low radio frequency coupling to plasma in the gap region. In an embodiment including two electrically parallel spatially concentric windings, the stacked segment extends beyond one side of an interconnection gap of two adjacent turns, and is aligned with the planar turn such that one end of the stacked segment is directly connected to an end of the planar turn via a straight, short stub. Terminals of the coil are connected to RF excitation circuitry terminals in a housing above the coil by leads extending smoothly and gradually without sharp bends between the coil terminals and the excitation circuitry terminals. Ends of the planar turn and the stacked segment are connected by a lead extending smoothly and gradually without sharp bends between its ends.

31 Claims, 7 Drawing Sheets

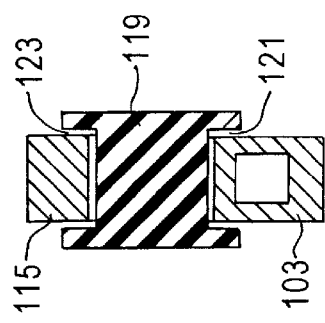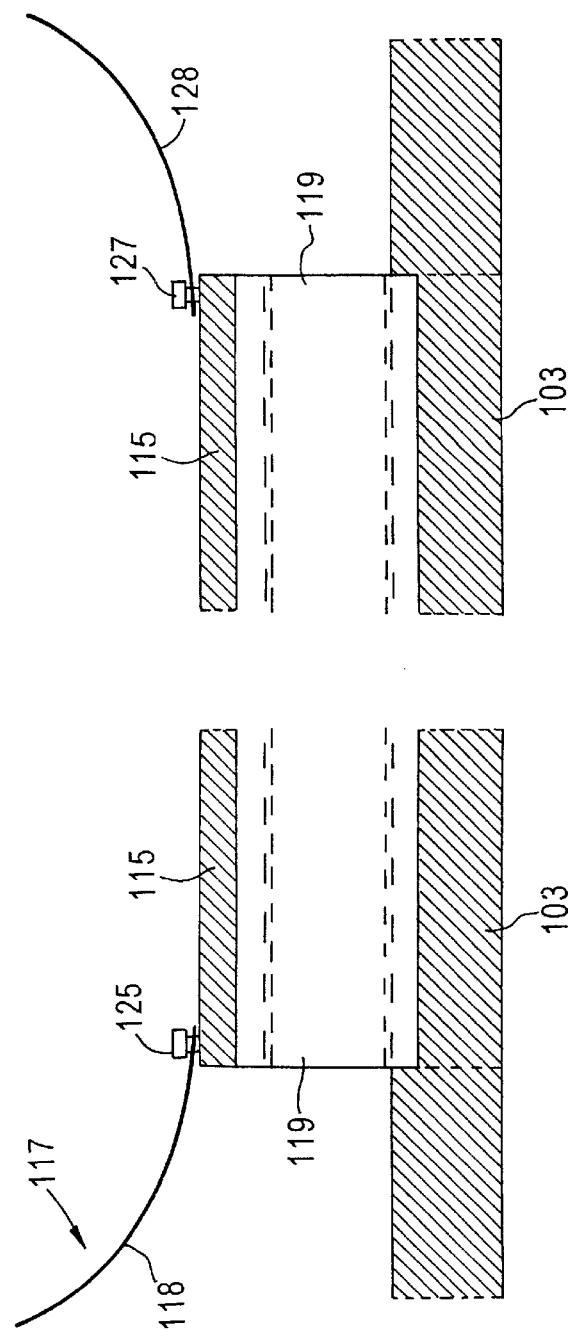

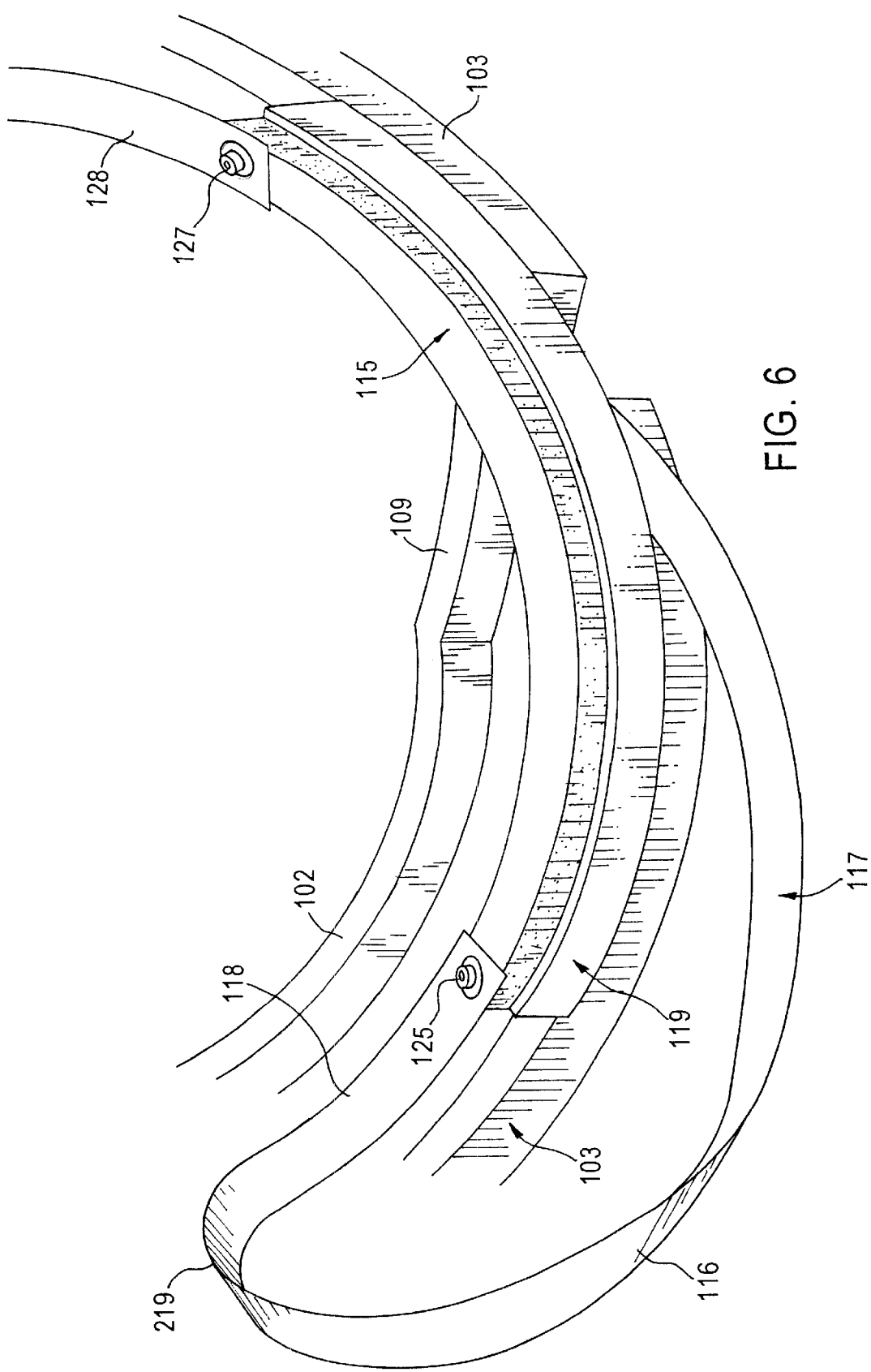

STACKED RF EXCITATION COIL FOR INDUCTIVE PLASMA PROCESSOR

FIELD OF THE INVENTION

The present invention relates generally to inductive plasma processors with RF plasma excitation coils and, more particularly, to such a processor with a coil including a planar winding segment that is electrically connected to a planar turn, wherein the segment is stacked vertically relative to a portion of the planar turn. Another aspect of the invention relates to a processor including a coil with a winding having a planar turn having ends that are in a first plane and connected with turns or partial turns having ends in a second plane wherein the coil is driven from RF excitation terminals that are spaced from the first and second planes and the turn ends are connected to (1) each other and/or (2) the excitation terminals by connecting structures that extend smoothly and gradually, without sharp bends, between opposite ends of the connection structure.

BACKGROUND ART

One type of processor for treating workpieces with an RF plasma in a vacuum chamber includes a coil connected to be responsive to an RF source by leads extending vertically between terminals located in a housing above the coil. The coil, which is usually planar or spherical or dome shaped, is driven by the RF source to produce electromagnetic fields that excite ionizable gas in the chamber to a plasma. The leads connecting the coil to the excitation source intersect terminals of the coil at right angles. Usually the coil is on or adjacent to a dielectric window that extends in a direction generally parallel to a planar horizontally extending surface of the processed workpiece. The excited plasma interacts with the workpiece in the chamber to etch the workpiece or to deposit material on it. The workpiece is typically a semiconductor wafer having a planar circular surface or a solid dielectric plate, e.g., a rectangular glass substrate used in flat panel displays, or a metal plate.

Ogle, U.S. Pat. No. 4,948,458 discloses a multi-turn spiral planar coil for achieving the above results. The spiral, which is generally of the Archimedes type, extends radially and circumferentially between its interior and exterior terminals connected to the RF source via an impedance matching network. Such coils produce oscillating RF fields having magnetic and electric field components that penetrate through a dielectric window to excite electrons and ions in a portion of the plasma chamber close to the window. The spatial distribution of the magnetic field in the plasma portion close to the window is a function of the sum of individual magnetic field components produced by the current at each point of the coils. The inductive component of the electric field is produced by the time varying magnetic field, while the capacitive component of the electric field is produced by the RF voltage in the coils. The inductive electric field is azimuthal while the capacitive electric field is vertical to the workpiece. The current and voltage differ at different points because of transmission line effects of the coil at the frequency of the RF source.

For spiral designs as disclosed by and based on the Ogle '458 patent, the RF currents in the spiral coil are distributed to produce a toroidal shaped electric field resulting in a toroidal plasma close to the window, which is where power is absorbed by the gas to excite the gas to a plasma. The toroidal shaped magnetic field is accompanied by a ring shaped electric field which generates a toroidal shaped plasma distribution. At low pressures, in the 1.0 to 10 mTorr range, diffusion of the plasma from the toroidal shaped region where plasma density is peaked tends to smear out plasma non-uniformity and increases plasma density in the chamber center just above the center of the workpiece. However, the diffusion alone generally can not sufficiently compensate plasma losses to the chamber walls and plasma density around the workpiece periphery can not be changed independently. At intermediate pressure ranges, in the 10 to 100 mTorr range, gas phase collisions of electrons, ions, and neutrals in the plasma further prevent substantial diffusion of the plasma charged particles from the toroidal region. As a result, there is a relatively high plasma density in a ring like region of the workpiece but low plasma densities in the center and peripheral workpiece portions.

These different operating conditions result in substantially large plasma flux (i.e., plasma density) variations between inside the toroid and outside the toroid, as well as at different azimuthal angles with respect to a center line of the chamber that is at right angles to the plane of the workpiece holder (i.e., chamber axis). These plasma flux variations result in a substantial standard deviation, i.e., in excess of six percent, of the plasma flux incident on the workpiece. The substantial standard deviation of the plasma flux incident on the workpiece has a tendency to cause non-uniform workpiece processing, i.e., different portions of the workpiece are etched to different extents and/or have different amounts of materials deposited on them.

Many arrangements directed to improving the uniformity of the plasma density incident on a workpiece have concentrated on geometric principles, usually concerning coil geometry. See, e.g., U.S. Pat. Nos. 5,304,279; 5,277,751; 5,226,967; 5,368,710; 5,800,619; 5,401,350; 5,558,722, 5,759,280, 5,795,429, 5,847,074 and 6,028,395. However, these coils have generally been designed to provide improved radial plasma flux uniformity and to a large extent have ignored azimuthal plasma flux uniformity or azimuthal symmetry.

Our commonly assigned U.S. Pat. No. 6,164,241 entitled "Multiple Coil Antenna for Inductively-Coupled Plasma Generation Systems," discloses another coil including two concentric electrically parallel windings each having first and second terminals, which can be considered input and output terminals of each winding. Each first terminal is connected via a first series capacitor to an output terminal of a matching network driven by an RF power source. Each second terminal is connected via a second series capacitor to a common ground terminal of the matching network and RF source. Each winding can include a single winding or multiple windings that extend circumferenfially and radially in a spiral-like manner relative to a common axis of the two windings. Each winding is planar or three-dimensional (i.e., spherical or dome-shaped) or separate windings of a single winding can be stacked relative to each other to augment the amount of electromagnetic fields coupled by a particular winding to the plasma.

Holland et al, U.S. Pat. No. 6,028,395, discloses a coil including plural electrically parallel windings. Peripheral parts of the windings are stacked vertically with respect to each other and a dielectric window separating the coil from the vacuum chamber interior. The stacked coil segments are arranged so that the electromagnetic fields resulting from current flowing in parallel through the two segments is additive, to assist in maintaining relatively uniform electromagnetic fields in the chamber and a relatively uniform plasma density on the workpiece.

The parallel connections of the stacked coil portions are established by struts that extend substantially perpendicular to the two parallel, stacked coil portions. Adverse effects may occur as a result of the leads being connected perpendicular to the coil terminals. In particular, we have found that the struts and leads seem to perturb the electromagnetic fields generated by the coil and stacked coil segments particularly around the region where the leads and coil terminals are connected. In addition the struts and leads have a tendency to produce in the coil relatively large standing wave variations which usually cause a non uniform plasma to be incident on the workpiece.

It is accordingly an object of the present invention to provide a new and improved coil for a vacuum plasma processor.

An additional object of the present invention is to provide a new and improved coil for a vacuum plasma processor wherein the plasma density incident on a workpiece of the processor has relatively high azimuthal and radial uniformity.

A further object of the invention is to provide a new and improved connection structure between RF excitation terminals driving a plasma excitation coil of a vacuum plasma processor and terminals of the coil.

Another object of the invention is to provide a new and improved connection structure between portions of a plasma excitation coil that are in different planes relative to a dielectric window of the processor.

SUMMARY OF THE INVENTION

According to one aspect of the invention, a vacuum plasma workpiece processor multi-turn plasma excitation coil which is arranged to be positioned above a window of a vacuum chamber of the processor has at least one substantially planar turn and a segment stacked with a portion of the planar turn. The stacked segment is spaced from the planar turn by a distance different from the spacing between the planar turn winding and the roof of the chamber interior (typically the window thickness) and is connected in series with the planar turn so the same current flows in the same direction through the planar turn and the stacked segment. The stacked segment is mainly used to increase the inductive RF coupling to a particular region of the plasma to improve the azimuthal, plasma uniformity and correct azimuthal asymmetries due to the chamber and coil not being perfectly symmetric. The position of the stacked segment, the arc length of the stacked segment, and spacing between the stacked segment and the planar turn are preferably selected for each chamber and/or coil configuration to optimize the RF coupling to a particular region of plasma.

The stacked segment preferably includes first and second terminals for series connection to the planar turn. The stacked segment forms an additional, extended partial turn having opposite first and second terminals connected to the planar turn. In one embodiment, a metal lead which establishes the connection between the second terminal of the stacked segment and a first end of the planar turn includes an interconnection loop. First and second ends of the loop are respectively connected to the second terminal of the stacked portion and the first end of the planar turn. The loop is bent gradually and smoothly without sharp bends such that it does not substantially perturb the electromagnetic fields produced by the stacked segment and the planar turn.

According to another aspect of the invention, a first metal connection structure has first and second ends respectively connected to an input terminal of the coil and an output of a matching network. A second metal connection structure has a first end connected to the coil output terminal and a second end connected to a termination capacitor. The first and second metal connection structures extend gradually and smoothly without sharp bends such that electromagnetic fields produced by them are constructively superimposed on the main fields produced by the coil (as well the stacked segment if applicable).

In accordance with a further aspect of the invention, a metal connection structure having first and second ends respectively connected to a first portion of the planar turn and an end of the stacked segment is arranged so it extends gradually and smoothly without sharp bends between the first and second ends thereof.

Preferably, the stacked segment is located adjacent an interconnection gap between ends of a planar winding. The stacked segment extends in both directions from the gap to compensate low RF coupling from the gap to the plasma.

In one embodiment, the metal connection structure includes (1) a first part that loops from the first end of the planar turn away from the gap so it extends in a direction away from the gap to a point that is farther from the gap than a first end of the stacked segment and (2) a second part that loops back from the point to the first end of the stacked segment. The first end of the metal connection structure preferably extends tangentially relative to the first end of the stacked segment. The stacked segment includes a second end that defines one of the coil terminals connected to be responsive to current from the RF source.

According to an additional aspect of the invention, a planar turn includes first and second end portions that are spatially close to each other and are spaced by a gap from each other so current flows around the remainder of the planar turn between the first and second end portions. One of the end portions is connected by a radially and circumferentially extending conductive strap to an adjacent turn of the winding. The stacked segment extends across the gap so first and second ends of the stacked segment are on opposite sides of the gap.

According to a first embodiment, first and second ends of the stacked segment are displaced by approximately equal angles from the interconnection gap between adjacent planar turns. The connecting structure is arranged so current first flows back in the direction opposite to the direction of current flow in the planar turn, then turns direction gradually following the gradually bent connection structure, and eventually flows in the same direction as the original current flow in the planar turn.

According to a second embodiment, the first and seconds ends of the stacked segment are arranged so the second end is displaced circumferentially across the gap interconnecting adjacent turns and extends substantially greater than the angular displacement of the gap to compensate low RF coupling from the gap region to the plasma. Preferably, the stacked segment has the second end of the stacked segment vertically overlaying the first end of the planar turn. The second end of the stacked segment can be connected to the first end of the planar turn via a short, straight connection so current continues to flow in the same direction in the planar turn.

The above and still further objects, features and advantages of the present invention will become apparent upon consideration of the following detailed descriptions of several specific embodiments thereof, especially when taken in conjunction with the accompanying drawings.

BRIEF DESCRIPTION OF THE DRAWING

FIG. 3 is a cross sectional view taken through the lines 3—3 of FIG. 2;

FIG. 4 is a side sectional view taken through the marks on FIG. 2;

FIG. 5 is a side sectional view taken through the marks on FIG. 2;

FIG. 6 is a perspective view of a portion of the coil illustrated in FIGS. 2–5;

DETAILED DESCRIPTION OF THE DRAWING

Figure 1:
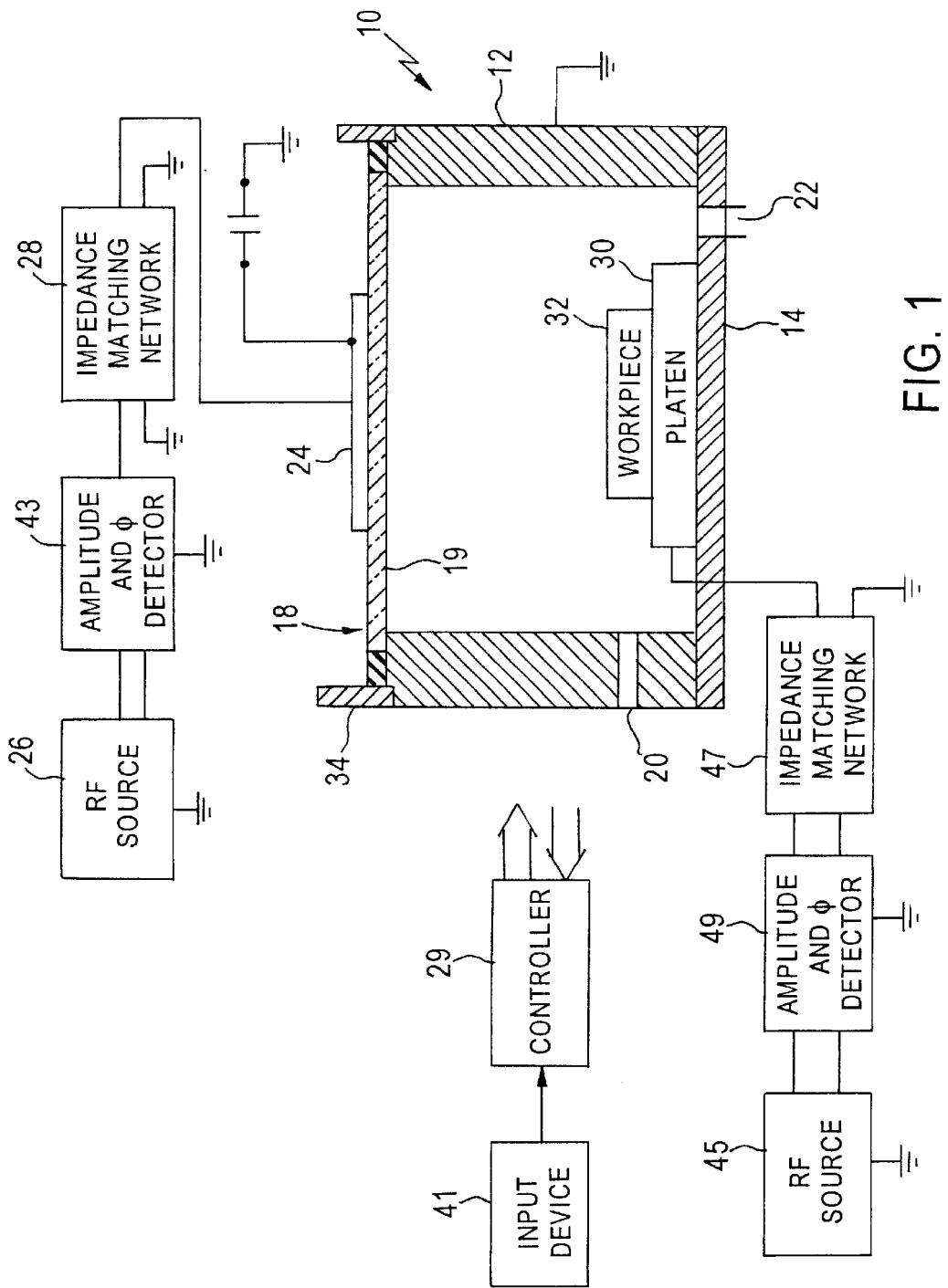
FIG. 1 is a schematic diagram of a vacuum plasma processor of the type employed in connection with the present invention.

The vacuum plasma workpiece processor of FIG. 1 of the drawing includes vacuum chamber 10, shaped as a cylinder having grounded metal wall 12, metal bottom end plate 14, and circular top plate structure 18, consisting of a dielectric window structure 19 having the same thickness from its center to its periphery. Sealing of vacuum chamber 10 is provided by conventional gaskets (not shown).

The processor of FIG. 1 can be used for etching a semiconductor, dielectric or metal substrate or for depositing materials on such substrates.

A suitable gas that can be excited to a plasma state is supplied to the interior of chamber 10 from a gas source (not shown) via port 20 in side wall 12 and further distributed uniformly through a gas distribution mechanism (not shown). The interior, of the chamber is maintained in a vacuum condition, at a pressure that can vary in the range of 1–1000 milliTorr, by a vacuum pump (not shown) connected to port 22 in end plate 14.

The gas in chamber 10 is excited by a suitable electric source to a plasma having a controlled spatial density. The electric source includes a planar or spherical or dome like coil 24, mounted immediately above window 19 and excited by variable power RF generator 26, typically having a fixed frequency of 13.56 MHz.

Impedance matching network 28, connected between output terminals of RF generator 26 and excitation terminals of coil 24, couples RF power from the generator to the coil. Impedance matching network 28 includes variable reactances which controller 29 varies in a known manner in response to indications of the amplitude and phase angle of the voltage reflected to the input terminals of the matching network, as sensed by detector 43. Controller 29 varies the values of the reactances in network 28 to achieve impedance matching between source 26 and a load including coil 24 and the plasma load the coil drives.

Controller 29 also responds to input device 41 to control variable reactances coupled to coil 24. Input device 41 can be a manual device, such as a potentiometer or keys of a key pad, or a microprocessor responsive to signals stored in a computer memory for different processing recipes of workpiece 32. Variables of the recipes include (1) species of gases flowing through port 20 into chamber 10, (2) pressure in chamber 10 controlled by the vacuum pump connected to port 22, (3) the total output power of RF source 26, which is substantially equal to the power supplied to coil 24, and (4) the values of capacitors connected to coil 24.

Workpiece 32 is fixedly mounted in chamber 10 to a surface of workpiece holder (i.e., platen or chuck) 30; the surface of holder 30 carrying workpiece 32 is parallel to the surface of window 19. Workpiece 32 is usually electrostatically clamped to the surface of holder 30 by a DC potential that a DC power supply (not shown) applies to a chuck electrode (not shown) of holder 30. RF source 45 supplies a radio frequency electromagnetic wave to impedance matching network 47 that includes variable reactances (not shown). Matching network 47 couples the output of source 45 to holder 30. Controller 29 responds to signals that amplitude and phase detector 49 derives to control the variable reactances of matching network 47 to match the impedance of source 45 to the impedance of an electrode (not shown) of holder 30. The load coupled to the electrode in holder 30 is primarily the plasma in chamber 10. As is well known the RF voltage that source 45 applies to the electrode of holder 30 interacts with charge particles in the plasma to produce a DC bias on workpiece 32.

Surrounding coil 24 and extending above top end plate 18 is a metal tube or can-like shield 34 having an inner diameter somewhat greater than the inner diameter of wall 12. Shield 34 decouples electromagnetic fields originating in coil 24 from the surrounding environment. The diameter of cylindrically shaped chamber 10 defines the boundary for the electromagnetic fields generated by coil 24. The diameter of dielectric window structure 19 is greater than the diameter of chamber 10 to such an extent that the entire upper surface of chamber 10 is comprised of dielectric window structure 19.

The distance between the treated surface of workpiece 32 and the bottom surface of dielectric window structure 19 is chosen to provide the most uniform plasma flux on the exposed, processed surface of the workpiece. For a preferred embodiment of the invention, the distance between the workpiece processed surface and the bottom of the dielectric window is approximately 0.2 to 0.4 times the diameter of chamber 10.

Coil 24 can include either one winding or plural parallel windings. In either arrangement, each winding is electrically long enough at the 13.56 MHz frequency of source 26 to function as a transmission line having a total electric length of about 30° to 45° to produce standing wave patterns along the length of the winding. The standing wave patterns result in variations in the magnitude of standing wave RF voltages and currents along the lengths of the windings. The dependence of the magnetic fluxes generated by the windings on the magnitude of these RF currents results in different plasma density being produced in different portions of chamber 10 beneath different windings of coil 24.

The variations in the RF current magnitude flowing in different parts of coil 24 are spatially averaged to assist in controlling plasma density spatial distribution. Spatially averaging these different current values can substantially prevent azimuthal asymmetries in the plasma density, particularly at regions of low RF current in the windings. Alternatively, the frequency of generator 26 is 4.0 MHz, in which case the windings of coil 24 are electrically short, about 10° to 15°, causing the standing wave currents and voltages in the windings to be substantially constant.

Figure 2:
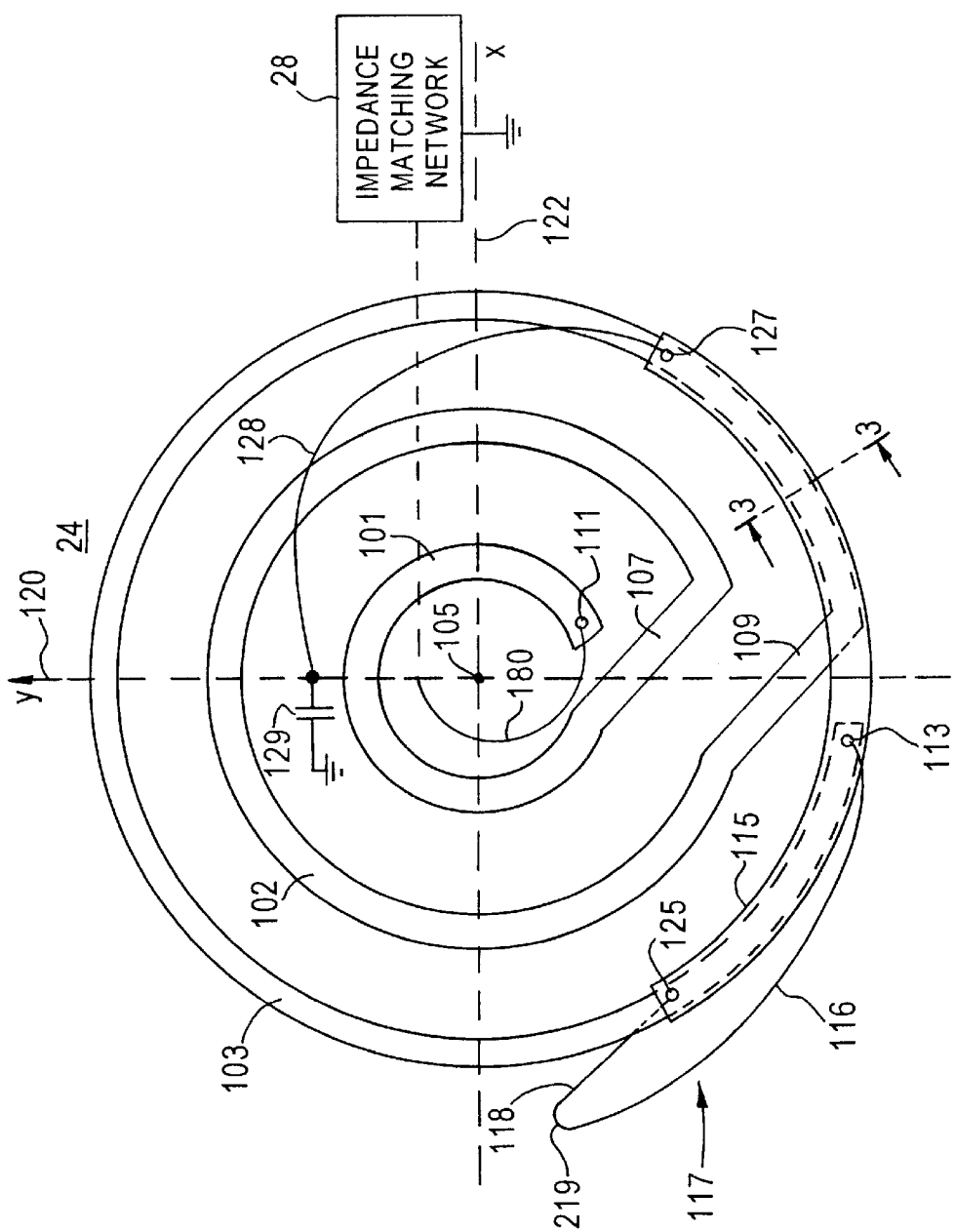
FIG. 2 is a top view of one embodiment of an RF excitation coil for use in the processor of FIG. 1.

Reference is now made to FIG. 2 of the drawing, a top view of one configuration of coil 24, FIG. 1. Coil 24 includes a single winding having three concentric turns 101, 102 and 103, all of which are a sector of a circle and lie in the same plane. Turns 101–103 are concentric with coil center axis 105, with turns 101, 102 and 103 having progressively larger radii. Each of turns 101–103 has an angular length that is about 340°, i.e. slightly less than one full revolution of a circle. Adjacent ends of turns 101, 102 and 103 are respectively interconnected to each other by straight radially and circumferentially extending winding segments 107 and 109, such that the inner and outer ends of segment 107 are respectively connected to adjacent ends of interior turn 101 and central turn 102, while the inner and outer ends of segment 109 are respectively connected to adjacent ends of central turn 102 and exterior turn 103. The other end of interior turn 101 includes terminal 111, connected by an appropriate cable or strap 180 to the RF voltage output terminal of matching network 28.

The other end terminal 113 of exterior turn 103 is connected in series with stacked coil segment 115 by sheet metal strap, i.e. lead, 117 made of silver plated copper. Stacked segment 115 (1) has an arc length of approximately 120°, (2) is shaped as a sector of a circle having a radius equal to the radius of turn 103, and (3) overlies and is aligned with a 120° sector of turn 103. Sector 115 extends for approximately 60° in each direction from y axis 120 of coil 24; y axis 120 is defined as a line extending through the coil center axis 105, and is equidistant from the ends of a 20° gap in turn 103 between first and second end portions of turn 103, that are spatially close to each other. Stacked segment 115 is positioned in a plane above and parallel to the plane of turns 101–103.

Preferably, each of turns 101–103 has a rectangular cross-section, such that the width of each cross-section is approximately 1.0 cm and the height of each cross-section is approximately 1.6 cm. Each of turns 101–103 is preferable made of silver coated copper and has a hollow center 124 through which cooling fluid flows, as illustrated in FIG. 3. Stacked segment 115 is preferably made of silver coated copper and has a solid rectangular cross-section, with a width of about 1.0 cm and a height of about 0.6 cm.

Dielectric support block 119 fixedly positions stacked segment 115 in a plane parallel to and above the plane of turns 101–103. Dielectric support block 119 has a generally rectangular shape and includes notches 121 and 123 into which the top and bottom portions of turn 103 and segment 115 respectively fit.

Segment 115 includes terminals 125 and 127, respectively positioned at equal angular displacements to the left and right of y axis 120, as illustrated in FIG. 2. Hence, terminal 125 is above the portion of turn 103 spaced about 50° from end terminal 113 of turn 103, while terminal 127 is above the portion of turn 103 spaced about 50° from the point of turn 103 connected by segment 109 to turn 102. One end of silver plated, copper sheet metal strap (i.e. lead) 128 is connected to terminal 127 and extends tangentially from the end of portion 115 where terminal 127 is located to assist in electromagnetic field distribution. The other end of strap 128 is connected to ground via termination capacitor 129.

The strap forming lead 117 includes portion 116 having a first end that initially extends away from the coil x and y axes 120 and 122, i.e. outwardly from terminal 113. Then portion 116 extends both vertically and substantially parallel to turn 103 and stacked segment 115 beyond terminal 125. Strap 117 also includes portion 118 that loops back toward turn 103, segment 115 and terminal 125. Portion 118 or 128 extends along a line tangent to a portion of segment 115 where terminal 125 or 127 is located as indicated in FIGS. 4 and 5. The second end of strap 117, at the end of portion 118, is mechanically and electrically connected to terminal 125 and the first end of the strap is mechanically and electrically connected to terminal 113. As illustrated in FIG. 6, the strap forming lead 117 is twisted and resembles a Mobius loop that is not completely closed.

Stacked segment 115 increases the inductive RF coupling to the region of the plasma aligned with the stacked segment to improve the azimuthal, plasma uniformity and correct azimuthal asymmetrics due to the chamber and coil not being perfectly symmetric, e.g., in the gap between opposite ends of turn 103. The position of stacked segment 115, the arc length of the stacked segment between terminals 125 and 127, and spacing between stacked segment 115 and the planar turn 103 are preferably selected for each chamber configuration to optimize the RF coupling to a particular region of plasma.

The configurations of stacked segment 115 and the strap forming lead 117 are desirable because the fields resulting from the current in portion 116 that is vertically bent away from turn 103 only slightly perturb the fields produced by the stacked segment and turn 103 and fields resulting from the current in portion 118 add constructively to other fields the coil produces. The configuration of the strap forming lead 117 is such that the current flowing from terminal 113 to terminal 125 does not produce an electromagnetic field that materially subtracts from the fields resulting from the combined effects of the currents flowing in the superimposed portion of turn 103 and segment 115 even though the current flowing through the portion 116 of strap 117 flows opposite to the currents flowing in the portions of turn 103 and stacked segment 115 between terminals 125 and 113. Portion 118 of strap 117 that is above the stacked segment 115 is substantially aligned with segment 115 such that portion 118 of strap 117 produces magnetic fluxes that are additive to the fluxes produced by the segment 115 and the overlapping portions of turn 103 beneath segment 115.

The frequency of source 26 and the length of coil 24 are preferably such that the coil is electrically short compared to a wavelength of RF source 26, (e.g. 20°–30° and no more than 45°). Hence, the current always flows in the same direction throughout coil 24, between terminal 111 and terminal 127. By appropriately selecting the value of capacitor 129, the amplitudes of standing wave currents at terminals 111 and 127 are approximately equal and there is a standing wave current peak amplitude in the center of coil 24, at a point equidistant from terminals 111 and 127.

The shape of strap 117, involving a smooth and gradual transition in height from turn 103 to segment 115, without any sharp bends between opposite ends of the strap, causes a gradual change of inductive coupling between turn 103 and segment 115 and does not disturb the coil electromagnetic field distribution. If turn 103 and segment 115 were connected by straps or other conductors that extended vertically directly between the winding and the segment, i.e. at a right angle to the plane of turns 101–103, there would be abrupt inductive coupling changes and substantial disturbances of the coil electromagnetic field distribution. These adverse effects would occur because turn 103 and segment 115 have the same RF current flowing through them and the strap connecting them (at right angles to the plane of turns 101–103) would produce a magnetic field which would orthogonally obstruct the field produced by turns 101–103 and segment 115.

Figure 7:
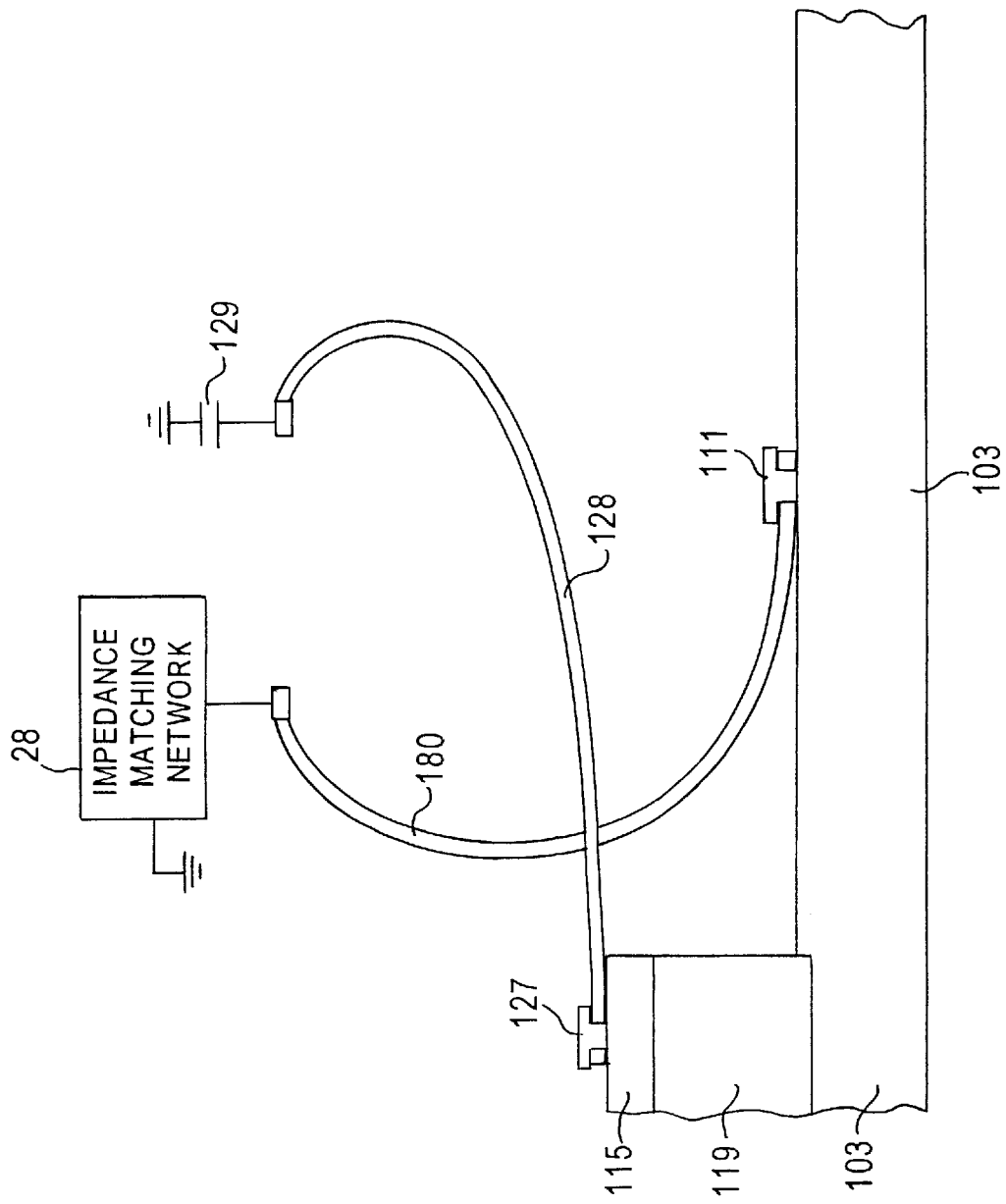
FIG. 7 is a side view of the coil of FIG. 2 in combination with metal straps connected between terminals of the coil and terminals of a housing including an RF source, for the coil.

As illustrated in FIG. 7, coil terminals 111 and 127 are connected respectively by metal straps 128 and 180 to ground through capacitor 129 and the output terminal of matching network 28, both located in a housing above coil 24. Many of the same advantages are provided by the smooth and gradual way (without sharp bends) strap 128 is connected between terminal 127 and capacitor 129. Opposite ends of strap 180 are connected to terminal 111 and the output terminal of matching network 28 in the same way as strap 128 and terminal 127 are connected to provide the same results.

Figure 8:
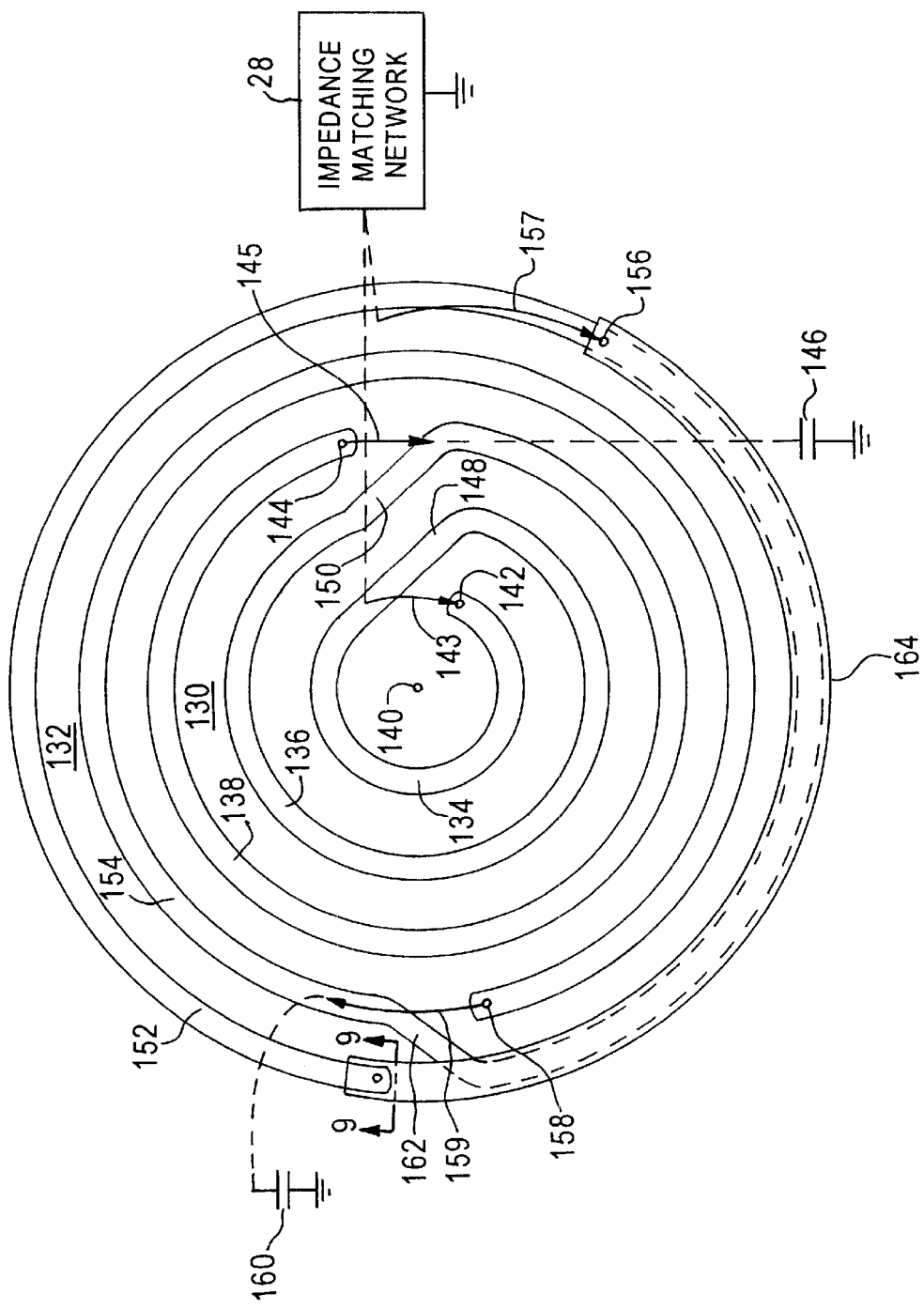
FIG. 8 is a top view of a second embodiment of an RF excitation coil for use in the processor of FIG. 1.

A stacked coil arrangement similar to the coil arrangement of FIGS. 2–6 can also be employed with a coil including two parallel, concentric windings driven in parallel by the RF output of matching network 28. Such a coil is illustrated in FIG. 8 as including interior and exterior multi-turn, approximately equal length windings 130 and 132, that are concentric with coil axis 140. The principle of operation of the multiple coils (or plural windings) is discussed in Chen et al, U.S. Pat. No. 6,164,241. Further details of operation of the coil without the stacked segment 164 shown in FIG. 8 can be also found in our co-pending application entitled "Inductive Plasma Processor Having Coil with Plural Windings and Method of Controlling Plasma Density," (LHGB Docket 2328-050 filed concurrently with the present application) which includes details of the matching network and tuning and controlling arrangements that are similar or identical to the matching network 28 and the tuning and controlling arrangements used for the coil in FIG. 8.

Winding 130 includes three turns 134, 136 and 138, each of which lies along a sector of a separate circle that is concentric with axis 140; the circles have different radii. Interior turn 134 and exterior turn 138 respectively include input excitation terminal 142 and output excitation terminal 144. Terminal 142 is connected to the power output terminal of matching network 28 by strap 143 while terminal 144 is connected by strap 145 to ground through a termination capacitor 146. It is to be understood that these connections can be reversed so terminal 142 is connected to ground through a termination capacitor and terminal 144 is connected to matching network 28. Straps 143 and 145 have the same configuration as strap 128. The ends of turns 134 and 138 are respectively connected to opposite ends of turn 136 by straight radially and circumferentially extending segments 148 and 150 of winding 130.

Winding 132 includes exterior turn 152 and interior turn 154 respectively including input excitation terminal 156 and output excitation terminal 158. Terminal 156 is connected by strap 157 to the power output terminal of matching network 28, while terminal 158 is connected by strap 159 to the ground via termination capacitor 160, or vice versa. Straps 157 and 159 have the same configuration as strap 128. Turnings 152 and 154 are connected to each other by straight circumferentially and radially extending coil segment 162. Turns 152 and 154 are concentric with coil axis 140 and spaced by different radii from axis 140. All of turns 134, 136, 138, 152 and 154 of the coil of FIG. 8 are substantially planar and have a cross-section the same as the cross-sections of turns 101–103, as illustrated in FIG. 3. The interconnection segments 148 and 150 in interior winding 130 are preferably aligned in a radial direction opposite to the segment 162 of exterior turn 152, to minimize the radial asymmetric effect of RF coupling on the plasma.

The coil of FIG. 8 includes arcuate segment 164 that is stacked above the plane of turn 152 and extends through an arcuate length of approximately 150°. Stacked segment 164 preferably has a solid cross section and is configured the same as stacked segment 115, as illustrated in FIG. 3. Segment 164 is held in place above a portion of turn 152 by a structure identical to structure 119, FIGS. 3–5. Stacked segment 164 is a sector of a circle having the same radius as turn 152, with a center at axis 140 so it is aligned with turn 152. One end of segment 164 includes terminal 156 connected to the power output terminal of matching network 28 by metal strap 157. A first end of strap 157, connected to terminal 156, extends (1) tangentially from the portion of segment 164 where terminal 156 is located and (2) in substantially the same plane as the top of the segment. Thence, strap 157 extends in a gradual and smooth manner (1) inwardly of winding 132 and (2) upwardly similar to the way a spiral staircase increases in height. A second, opposite end of strap 157 is connected to the RF output terminal of impedance matching network 28. Strap 143 also extends in a smooth and gradual manner, similar to a spiral staircase, between terminal 142 and the RF output terminal of impedance matching network 28.

Figure 9:
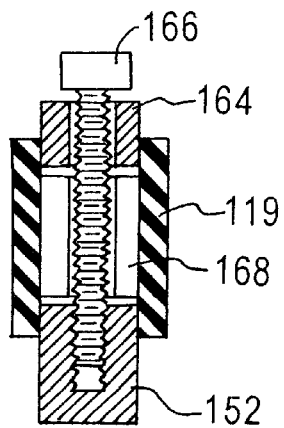
FIG. 9 is a side view of a portion of the coil of FIG. 8.

The end of stacked segment 164 opposite from terminal 156 is substantially aligned with the end of turn 152 and is electrically and mechanically connected to turn 152 by a vertically extending metal screw 166 and a metal spacer 168 at the end of turn 152, where there is no hollow cross section and a threaded hole in turn 152 can be made either completely through or deep enough, as illustrated in FIG. 9. Spacer 168 is preferably made of silver-plated copper while screw 166 is made of silver-plated stainless steel or brass to provide good mechanical strength. By tightening screw 166, current continuously flows from segment 164 through screw 166 and spacer 168 to turn 152.

Figure 10:
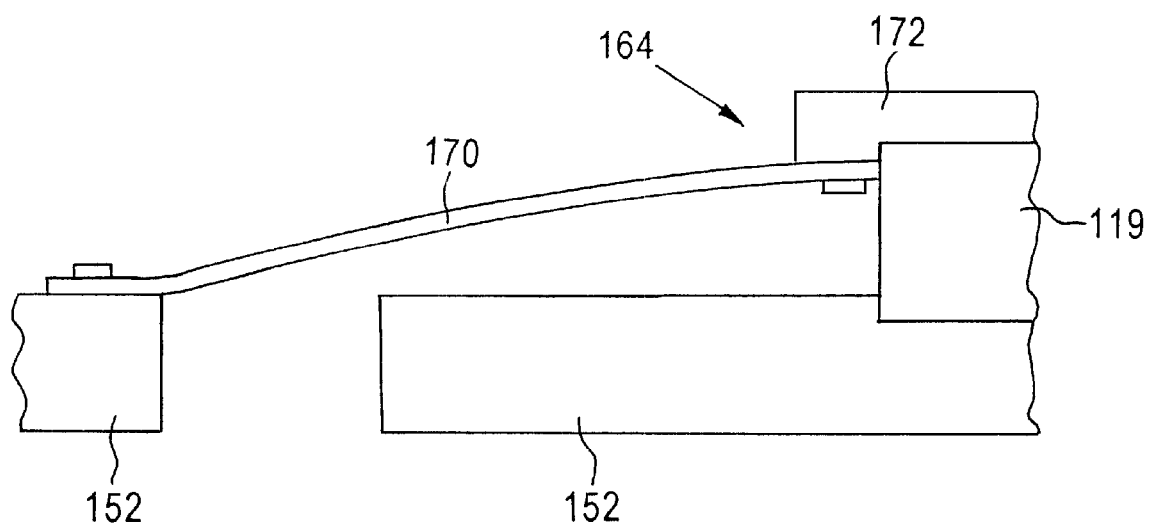
FIG. 10 is a side view of a portion of a coil that is a modification of the coil of FIG. 8.

As a further alternative, as illustrated in FIG. 10, segment 164 includes metal strap 170 and solid metal portion 172. Opposite ends of strap 170 are respectively connected to the end of turn 152 and a first end of solid metal portion 172 that extends in a plane parallel to turn 152 and is supported by block 119. Metal strap 170 extends smoothly and gradually between the ends of turn 152 and the first end of solid metal portion 172.

In operation, the coil of FIG. 8 has a relatively short electric length, i.e., the frequency of source 26 (e.g., 4 MHz) and the lengths of windings 130 and 132 are such that the standing wave current in each of windings 130 and 132 is approximately 20° to 30° in electrical length. Consequently, there are no substantial standing wave current and voltage wave variations along the lengths of windings 130 and 132. The positions of input terminals 142 and 156, which are driven in parallel by the RF output terminal of network 28, and the short electrical lengths of the windings are such that RF currents along the same azimuthal angles of turns 134, 136, 138, 152 and 154 flow in substantially the same direction. The values of termination capacitors 146 and 160 are respectively selected to adjust the overall impedances of windings 130 and 132 to control the current in each winding, i.e., the lower the impedance is, the higher the current is.

Because the magnitude and direction of the current flowing in the segment of turn 152 below stacked segment 164 is about the same as in the stacked segment, the magnetic field resulting from current flowing through stacked segment 164 aids the magnetic field resulting from the current flowing through the portion of turn 152 aligned with stacked segment 164. Overall, the coil produces electromagnetic field distributions that can be altered azimuthally to correct or compensate plasma azimuthal non-uniformity to a substantial extent.

While there have been described and illustrated specific embodiments of the invention, it will be clear that variations of the details of the embodiments specifically illustrated and described may be made without departing from the true spirit and scope of the invention as defined in the appended claims. For example, many of the principles of the invention are not limited to coils having one or two windings but are applicable to coils having three or more windings.

What is claimed is:

1. A radio frequency plasma excitation coil for a vacuum plasma processor, the coil being arranged to be positioned above a window of a vacuum chamber of the processor, the coil comprising at least one winding having multiple turns, at least one of the turns being substantially planar, a segment of at least one winding being stacked with only a portion of the one turn so it is spaced from the plane of the one turn, the stacked segment being connected in series with the one turn so the same current flows in the same direction through the one turn and the stacked segment.

2. The coil of claim 1 wherein the segment includes a first terminal for connection to a terminal of an excitation source or to ground through a termination capacitor and a second terminal connected to the one winding.

3. The coil of claim 2 wherein the second terminal is connected to a portion of the one turn substantially aligned with the second terminal.

4. The coil of claim 2 wherein the second terminal is connected to a portion of the one turn overlaid by a portion of the stacked segment between the first and second terminals of the stacked segment.

5. The coil of claim 4 further including a metal lead establishing the connection between the stacked segment and the portion of the one turn, the metal lead including a loop having first and second parts respectively connected to the second terminal and the portion of the one turn, the first part of the loop being generally aligned with some of the one turn and extending from the second terminal, the second part of the loop being generally misaligned from the one turn.

6. The coil of claim 1 wherein at least one of the coil and chamber have a geometry tending to cause the plasma density to have an azimuth asymmetrical distribution, the stacked segment being positioned to increase inductive coupling from the coil to a particular region of the plasma to reduce the azimuthal asymmetrical distribution.

7. A vacuum plasma workpiece processor including the coil of claim 6.

8. A vacuum plasma workpiece processor including the coil of claim 1.

9. A radio frequency excitation coil arrangement for a vacuum plasma workpiece processor, the coil arrangement being adapted to be positioned outside a planar window of a vacuum chamber of the processor and in sufficient proximity to the window to couple electromagnetic energy into the chamber through the window, the coil arrangement comprising at least one winding, opposite first and second ends of the winding being planar, the winding when positioned outside the window to couple electromagnetic energy into the chamber being positioned so the opposite ends thereof extend substantially parallel to the planar window, first and second excitation terminals providing connections for current flowing between an RF plasma excitation source and the opposite ends of the winding, a first metal connection structure having a first end connected to the first excitation terminal and a second end connected to the first end of the winding, a second metal connection structure having a first end connected to the second excitation terminal and a second end connected to the second end of the winding, the first and second metal connecting structures extending gradually and smoothly without sharp ends between the ends thereof.

10. The radio frequency excitation coil arrangement of claim 9, wherein the ends of the connection structures connected to the ends of the winding are co-planar with the ends of the winding.

11. The coil of claim 10 in combination with a vacuum plasma workpiece processor including a vacuum chamber having a planar window, the window being positioned outside the planar window as stated in claim 10.

12. The radio frequency excitation coil arrangement of claim 9 wherein the winding includes at least one planar turn, the winding when positioned outside the window to couple electromagnetic energy into the chamber being positioned so the planar turn extends substantially parallel to the planar window, the winding including a segment stacked with respect to a portion of the planar turn, the stacked segment being displaced from the plane of the planar turn, the stacked segment having a first end, the planar turn having a first end, a third metal connection structure having first and second ends respectively connected to the first end of the stacked segment and to the first end of the planar turn, the third metal connecting structure extending gradually and smoothly without sharp bends between the ends thereof.

13. The coil of claim 12 in combination with a vacuum plasma workpiece processor including a vacuum chamber having a planar window, the coil being positioned outside the planar window as stated in claim 11.

14. The coil of claim 9 in combination with a vacuum plasma workpiece processor including a vacuum chamber having a planar window, the coil being positioned outside the planar window as stated in claim 9.

15. A radio frequency excitation coil for a vacuum plasma workpiece processor, the coil being arranged to be positioned above a window of a vacuum chamber of the processor, the coil comprising at least one winding having multiple turns, at least one of the turns being substantially planar, a segment of the at least one winding being stacked with only a portion of the planar turn so the segment is spaced from the plane of the planar turn, the stacked segment being connected with the planar turn, a metal connection structure having first and second ends respectively connected to a first portion of the planar turn and an end of the stacked segment, the connection structure being arranged so it extends gradually and smoothly without sharp bends between the first and second ends thereof.

16. The coil of claim 15 wherein the first portion of the planar turn is at a first end of the planar turn.

17. The coil of claim 16 wherein the stacked segment extends across an interconnection gap between two planar turns of the winding and in opposite directions from the gap.

18. The coil of claim 17 wherein the metal connection structure loops from the first end of the planar turn away from the gap.

19. The coil of claim 17 wherein the metal connection structure loops from the first end of the planar turn away from the gap so it extends in a direction away from the gap to a point that is farther from the gap than the end of the stacked segment.

20. The coil of claim 19 wherein the second end of the metal connection structure extends tangentially relative to the end of the stacked segment.

21. The coil of claim 10 in combination with a vacuum plasma workpiece processor including a vacuum chamber having a planar window, the coil being positioned outside the planar window as stated in claim 10.

22. A radio frequency excitation coil for a vacuum plasma workpiece processor, the coil being arranged to be positioned above a window of a vacuum chamber of the processor, the coil comprising at least one winding having multiple turns, at least one of the turns being substantially planar, a segment stacked with a portion of the planar turn so it is spaced from the plane of the planar turn, the stacked segment of the at least one winding being connected with the planar turn, the planar turn including first and second end portions that are spatially close to each other and spaced by a gap from each other, the stacked segment extending across the gap so first and second ends of the stacked segment are on opposite sides of the gap.

23. The coil of claim 22 wherein the first and second ends of the stacked segment are displaced by approximately equal angles from the gap.

24. The coil of claim 22 wherein the first and second ends of the stacked segment are arranged so the second end has an angular displacement from the gap that is substantially greater than the angular displacement from the gap of the first end.

25. The coil of claim 22 wherein the stacked segment is arranged and the first end thereof is connected to the first end of the planar turn for causing current to flow between the first end of the stacked segment and a portion of the stacked segment overlying the gap in the same direction that current flows in the planar turn between a portion of the planar turn overlaid by the first end of the stacked segment and the first end of the planar turn.

26. The coil of claim 25 wherein the connection between the first end of the planar turn and the first end of the stacked segment is provided by a connecting structure that extends gradually and smoothly without sharp bends between the first end of the planar turn and the first end of the stacked segment.

27. The coil of claim 26 wherein the connecting structure is arranged for causing current in a first portion thereof extending spatially between the first end of the planar turn and a region above the plane of the planar turn aligned with the first end of the stacked segment to flow in a direction opposite to the direction of current flow in the planar turn between the portion of the planar turn overlaid by the first end of the stacked segment and the first end of the planar turn.

28. The coil of claim 26 wherein the connecting structure and the stacked segment are arranged for causing current to flow therein in the same direction as current flows in the portions of the planar turn that are overlaid by the connecting structure and the stacked segment on both sides of the gap.

29. The coil of claim 25 wherein the connection between the first end of the planar turn and the first end of the stacked segment is provided by a connecting structure, the connecting structure being arranged for causing current in a first portion thereof extending spatially between the first end of the planar turn and a region above the plane of the planar turn aligned with the first end of the stacked segment to flow in a direction opposite to the direction of current flow in the planar turn between the portion of the planar turn overlaid by the first end of the stacked segment and the first end of the planar turn.

30. The coil of claim 25 wherein the stacked segment is connected to the first end of the planar turn for causing current to flow in the stacked segment in the same direction as current flows in the portions of the planar turn that are overlaid by the connecting structure and the stacked segment on both sides of the gap.

31. A vacuum plasma workpiece processor including the coil of claim 22.

* * * * *